United States Patent [19]

Josephs et al.

[11] 4,413,197
[45] Nov. 1, 1983

[54] FOUR JOSEPHSON JUNCTION DIRECT-COUPLED AND GATE CIRCUIT

[75] Inventors: Richard M. Josephs, Willow Grove; Tsing-Chow Wang, Norristown, both of Pa.

[73] Assignee: Sperry Corporation, New York, N.Y.

[21] Appl. No.: 298,149

[22] Filed: Aug. 31, 1981

[51] Int. Cl.³ .......................................... H03K 19/195
[52] U.S. Cl. ..................................... 307/462; 307/306
[58] Field of Search ............... 307/245, 306, 462, 476; 357/5; 365/162

[56] References Cited

U.S. PATENT DOCUMENTS

| 4,149,097 | 4/1979 | Faris | 307/476 |
|---|---|---|---|
| 4,275,314 | 6/1981 | Fulton | 307/462 |
| 4,313,066 | 1/1982 | Gheewala | 307/462 |
| 4,371,796 | 2/1983 | Takada | 307/245 |

*Primary Examiner*—John Zazworsky
*Attorney, Agent, or Firm*—John B. Sowell; Thomas J. Scott; Marshall M. Truex

[57] ABSTRACT

A Josephson junction AND gate logic circuit is provided which has an enhanced and improved operating window area. The circuit comprises two parallel branches one for the input and one for the output connected between a biasing current source and a ground or reference voltage. The input branch is provided with a first branch resistor, a third Josephson junction and an interferometer in series between the current source and ground. A plurality of input gate signal lines connects to the interferometer and a sink resistor is connected in parallel with the interferometer. When the input current signals collectively exceed a predetermined level, the two Josephson junctions in the interferometer switch ON and assume the high impedance state. The input current and biasing current is diverted into the output branch causing the second Josephson junction in the output branch to switch ON. The biasing current in the output branch creates a high-gain current to the load circuit connected in parallel with the second Josephson junction.

8 Claims, 3 Drawing Figures

FOUR JOSEPHSON JUNCTION DIRECT-COUPLED AND GATE CIRCUIT

BACKGROUND OF THE INVENTION

1. Field of the Invention

This invention relates to an improved superconductive Josephson junction logic circuit, and more particularly, to a novel Josephson junction AND gate logic circuit.

2. Related Applications

This invention is an improvement of our co-pending "Three Josephson Junction Direct Coupled Isolation Circuit", Ser. No. 298,148 filed Aug. 31, 1981 which shows and describes a novel Josephson junction logic circuit preferably employed as an OR logic circuit but could be employed as an AND logic circuit.

3. Description of the Prior Art

The prior art logic circuits employing Josephson junction devices are generally classified in U.S. Class 307, subclass 306 with superconductive devices. The prior art includes IBM Journal of Research and Development, Vol. 24, Number 2, March 1980 at pages 130–132. This IBM article discloses at page 132 a two input AND gate Josephson junction circuit employing three interferometers having eight Josephson junctions. This AND gate circuit is inductively coupled at the inputs and at the outputs which places limitations on the speed of operation of this complex circuit.

Another form of Josephson junction circuit which may be adapted to AND gate logic is disclosed in IEEE, International Electron Devices meeting at Washington, D.C., Dec. 3–5, 1979 at pages 482–484. This Josephson junction circuit is based on direct coupled logic (DCL) wherein the two inputs to the AND gate are directly coupled to the logic circuitry. This Josephson junction circuit includes ten Josephson junctions arranged as two OR logic functions followed by amplification followed by an output stage which includes an interferometer.

Both of the above Josephson junction circuits are complex which makes them undesirable for integrated circuit implementation.

It would be desirable to provide a new Josephson junction AND gate logic circuit which can be employed as a logic module building block and which has two direct coupled inputs and multiple outputs having a large margin of safety for driving identical logic module loads.

SUMMARY OF THE INVENTION

It is a principal object of the present invention to provide a novel Josephson junction logic module building block for AND gate functions.

It is another principal object of the present invention to provide a novel Josephson junction circuit having multiple inputs and a plurality of stable high-gain outputs capable of driving at least three identical output loads with sufficient margin of safety.

It is another object of the present invention to provide a four Josephson junction direct coupled circuit having a larger and improved operating window area over prior art devices having more Josephson junction devices.

It is yet another object of the present invention to provide a novel Josephson junction circuit which is simplified in designs and improves the speed of operation of the AND gate function.

It is a general object of the present invention to provide a simplified four Josephson junction AND gate logic circuit which can be easily implemented as an integrated circuit having thousands of module building blocks on a single integrated circuit chip.

According to these and other objects of the present invention, there is provided a four Josephson junction circuit having two inputs and a plurality of output loads connected to a common output node. A biasing current source and a low reference or ground voltage are provided. A first input branch is electrically connected in series between said biasing current source and said reference voltage. The first branch comprises a first branch resistor, a third Josephson junction device and an interferometer device in series between said biasing current source and said low reference voltage. A sink resistor is connected between the interferometer and the reference voltage and is in parallel therewith. A second output branch comprises a second branch resistor in series with a second Josephson junction device and is electrically connected in series between said biasing current source and said reference voltage. A signal output node is provided intermediate to said second Josephson junction and said second branch resistor. The output loads are connected between the signal output node and the ground voltage and are in parallel therewith. The critical currents of the two Josephson junction devices in the interferometer are selectively predetermined to cause the switching sequence of the devices to occur in the order that the interferometer switches before the second Josephson junction and the second Josephson junction switches before the third Josephson junction.

DESCRIPTION OF THE PREFERRED EMBODIMENT

The term Josephson junction as used in this application shall mean any two superconducting electrodes separated by a very thin oxide barrier and operating near four degrees kelvin in temperature. The Josephson junction is capable of conducting a critical amount of current $I_0$ before developing a voltage across the electrodes.

The term operating window or operating window area as used in this application shall mean the area of a curve in which the Josephson junction is switched ON in a biasing current versus input current diagram.

The term threshold as used in this application shall mean the point at which a particular Josephson junction device first becomes switched ON as defined on a biasing current versus input current diagram. The threshold shall also be defined as the boundary of the operating window area.

The term flux quantum $\phi_0$ shall mean $h_{2e}$ wherein h is the Planck constant and e is the electron charge. In this application $\phi_0$ is equal to $2.07 \times 10^{-15}$ volt seconds.

Figure 1:
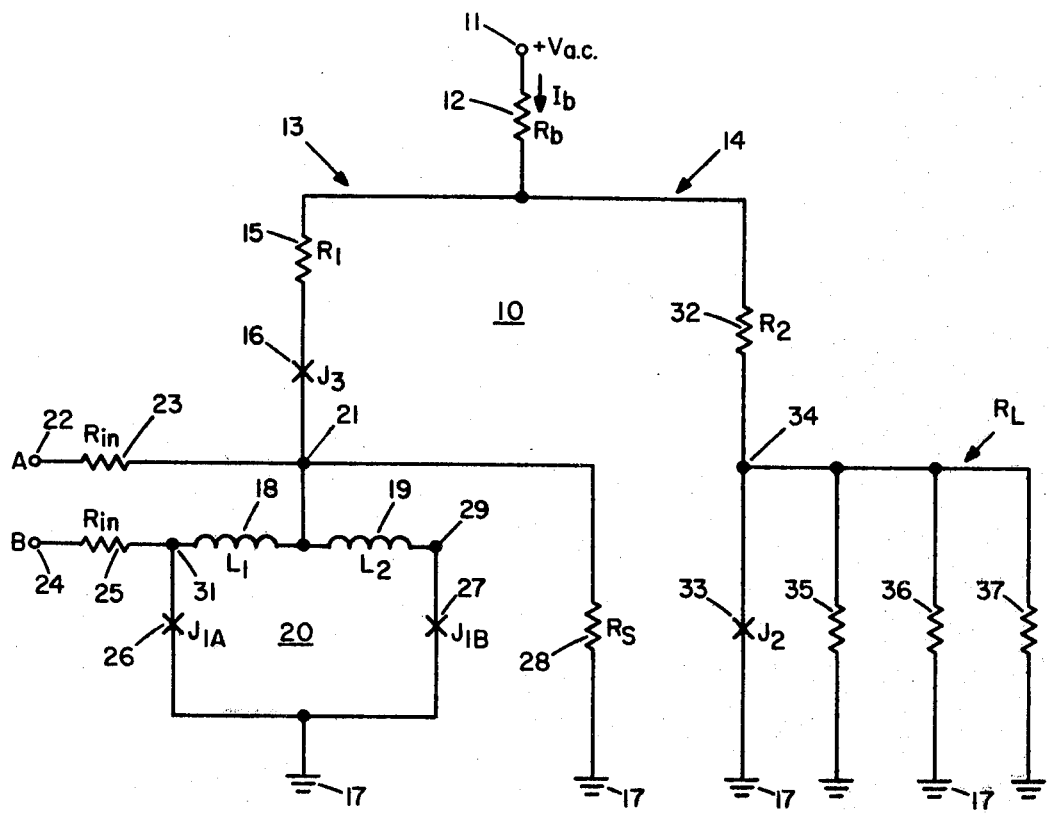
FIG. 1 is a logic circuit diagram showing the elements and/or equivalent circuit elements of the present invention Josephson junction circuit.

Refer now to FIG. 1 showing a logic circuit of the present invention AND gate. The circuit 10 comprises an alternating current source 11 and a current source resistor 12 connected to a first branch 13 and a second branch 14 of the present circuit. The first branch 13 has a first branch resistor 15 connected in series with a third Josephson junction 16 which in turn is connected in series with an interferometer 20 which connects to the low reference voltage or ground 17. The preferred embodiment interferometer includes a pair of inductive reactances 18 and 19 which form parallel branches with the input node 21 connected to the A input 22 via an input resistor 23. The interferometer 20 is also connected to a second input 24 via a second input resistor 25. The second input resistor 25 connects to a point 31 intermediate to the first inductive reactance 18 and one of the unmatched Josephson junction devices 26 of the interferometer circuit 20. The second unmatched Josephson junction device 27 is connected in series between the second inductive reactance 19 and the ground source 17. Connected to the input node 21 and in parallel with the interferometer 20 there is provided a sink resistor 28. While the embodiment of FIG. 1 shows that the sink resistor 28 is preferably connected intermediate to the junctions of the inductive reactances 18, 19, it may be connected at the end points 29 or 31 of the inductive reactances 18, 19 without changing the preferred operating characteristics of the present invention.

The second branch 14 of the preferred embodiment Josephson junction circuit 10 comprises a second branch resistor 32 connected in series with a second Josephson junction 33 which is connected to ground 17. Intermediate to the second branch resistor 32 and the second Josephson junction 33 there is provided an output node 34 to which there is connected in parallel a plurality of output loads 35, 36 and 37.

The gain of the novel circuit 10 provides sufficient output current to drive three identical loads, such as loads 35, 36 and 37, with an adequate margin of safety.

During each cycle of operation the pulsating a.c. current source is supplied at point 11 and the biasing current in resistor 12 is distributed through the two branches 13 and 14 so as to provide a current at node 21 which biases the Josephson junctions 26 and 27 of the interferometer 20 by supplying current through the inductive reactances 18 and 19. The two gate inputs 22 and 24 to the AND gate circuit 10 are both supplied with current to initiate switching circuit 10, however, the amount of current at either input 22 or 24 is insufficient alone to initiate switching of the interferometer. The additive current of the two inputs 22 and 24 will cause the Josephson junction 26 in the first branch of the interferometer 20 to initiate switching and shortly thereafter will cause the Josephson junction 27 in the second branch of the interferometer 20 to switch. Shortly after the two junctions 26 and 27 of the interferometer have completed switching, the second Josephson junction 33 in the second branch 14 of the AND gate circuit 10 will switch causing the sequential operation of the third Josephson junction 16 in the first branch 13 of the AND gate circuit 10 to switch. After the third Josephson junction 16 switches, it goes to a high impedance state causing the input currents at the inputs 22 and 24 to be diverted through the sink resistor 28 to ground. Further, when the third Josephson junction 16 switches, its high impedance state provides isolation between the input current source and the inputs 22, 24. Also most of the input biasing current in resistor 12 is diverted through the second branch resistor 32 to the output loads 35, 36 and 37. In the preferred embodiment AND gate circuit 10, there are a number of conditions which provide optimum conditions of operation as follows:

$R_1$ resistance 15 × critical current $I_{03}$ of the third Josephson junction 16 is equal to the product of the second branch $R_2$ resistor 32 × the critical current $I_2$ of the second Josephson junction 33.

The critical current $I_{01A}$ of the first Josephson junction 26 of the interferometer 20 × the $L_1$ inductance 18 is equal to the critical current $I_{01B}$ of the second Josephson junction 27 of the interferometer 20 × the $L_2$ inductance 19.

$(L_1 + L_2) \times I_{01B}$ is equal to $1.5 \times \phi_0$.

The ratio of the critical currents $I_{01A}$, $I_{01B}$, $I_{02}$ and $I_{03}$ of the Josephson junctions 26, 27, 33 and 16 are equal to one, three, four and two.

The total load impedance 35, 36, 37 is greater than four times the sink resistance $R_s$.

The sink resistance $R_s$ is greater than either of the branch resistances $R_1$ or $R_2$.

These optimum conditions were established when the biasing current $I_b$ was seventy percent of the sum of the critical currents $I_{02}$ plus $I_{03}$ of Josephson junctions 33 and 16. When $I_b$ is 420 microamps $I_{02}$ and $I_{03}$ are 400 and 200 microamps respectively. Resistors 12, 15, 28, 32 and 35, 36 and 37 are 24.0 ohms, 0.6 ohms, 1.0 ohms, 0.3 ohms and fifteen ohms each respectively.

Having explained the preferred embodiment ratios and conditions imposed on the AND gate 10 and the interferometer 20, it will be understood that a typical condition is when the Josephson junction 26 has one hundred microamps critical current, the Josephson junction 27 has three hundred microamps critical current, the Josephson junction 33 has four hundred microamps and the Josephson junction 16 has two hundred microamps. Under these conditions, seventy percent of the biasing current $I_b$ represented by the sum of the critical currents $I_{02}$ in Josephson junction 33 and $I_{03}$ Josephson junction 16 is equal to four hundred and twenty microamps. Under these conditions the total input current at the inputs 22 and 24 need only be approximately eighty microamps each (but less than two hundred fifty microamps) to initiate switching of the interferometer 20. After the AND gate 10 switches there is provided approximately three hundred microamps at the output node 34 which can be supplied to the output loads 35, 36 and 37. Thus, the gain and fan-out is in excess of three to one.

Figure 2:
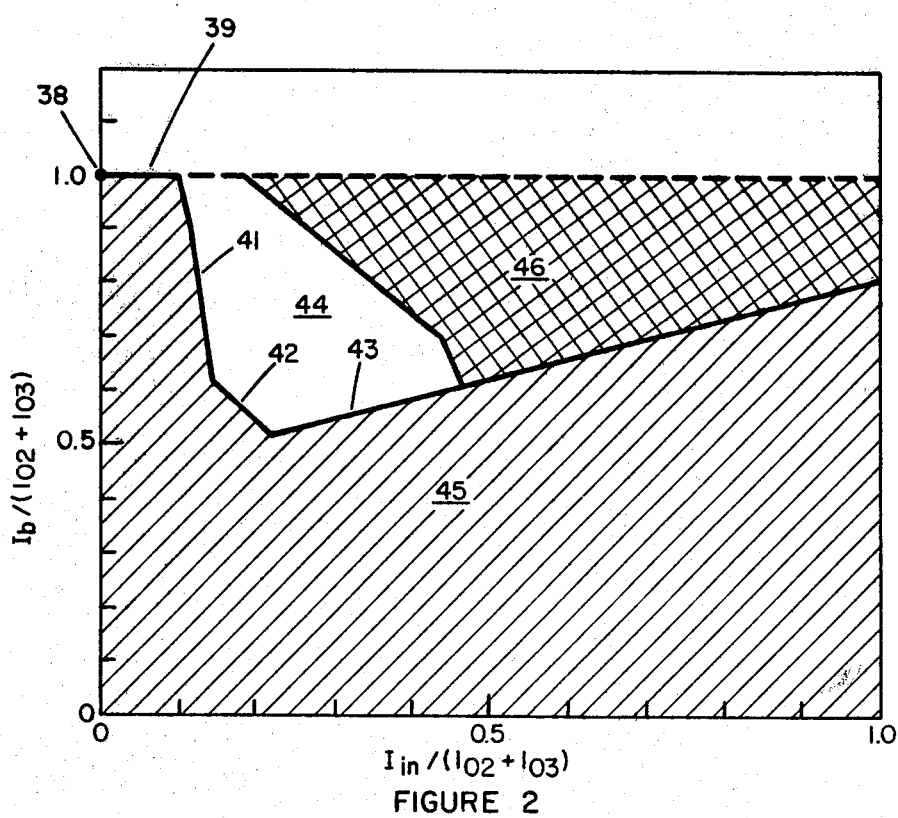
FIG. 2 is a diagram illustrating the operating window area and the threshold curve of the complete circuit of FIG. 1.

Refer now to FIG. 2 showing an operating window area and threshold curve for the circuit of FIG. 1. The abscissa represents the current input $I_{in}$ of the two inputs 22 and 24 when they are identical and the ordinate represents the biasing current $I_b$ passing through the biasing resistor 12 from the current source 11. These two currents are normalized by dividing them by the total of the critical currents $I_0$ in the Josephson junctions 16 and 33. Thus, it will be understood that the values given on the X and Y coordinates of FIG. 2 are dimensionless. Point 38 represents the minimum biasing current $I_b$ in the absence of the input signal $I_{in}$ which is capable of initiating switching of the Josephson junction circuit 10. Line 39 represents the level of biasing current $I_b$ at which the Josephson junction circuit 10 is capable of switching. The line 41 represents the locus of points or values where the interferometer 20 is capable of switching. Once the interferometer 20 has completed switching, line 42 represents the locus of points or values where the second Josephson junction 33 is capable of switching. Similarly, the line 43 represents the locus of points or values where the third Josephson junction 16 is capable of switching. These lines 41, 42 and 43 define the boundary or threshold of the operating window area 44 in which the Josephson junction 10 is switched ON. The sectioned area 45 represents the points of operation of the circuit 10 where the circuit is still in the zero voltage output state. The cross-hatched area 46 represents that operating window area in which the Josephson junction circuit 10 has been switched by a sufficient amount of input current at one of the inputs 22 or 24 alone. Thus, it will be understood that the preferred embodiment AND gate may be operated as an OR gate when sufficient current is supplied to inputs 22 or 24 to drive the circuit into the operating state shown by the cross-hatch area 46, even though the gain and fan-out are diminished.

Figure 3:
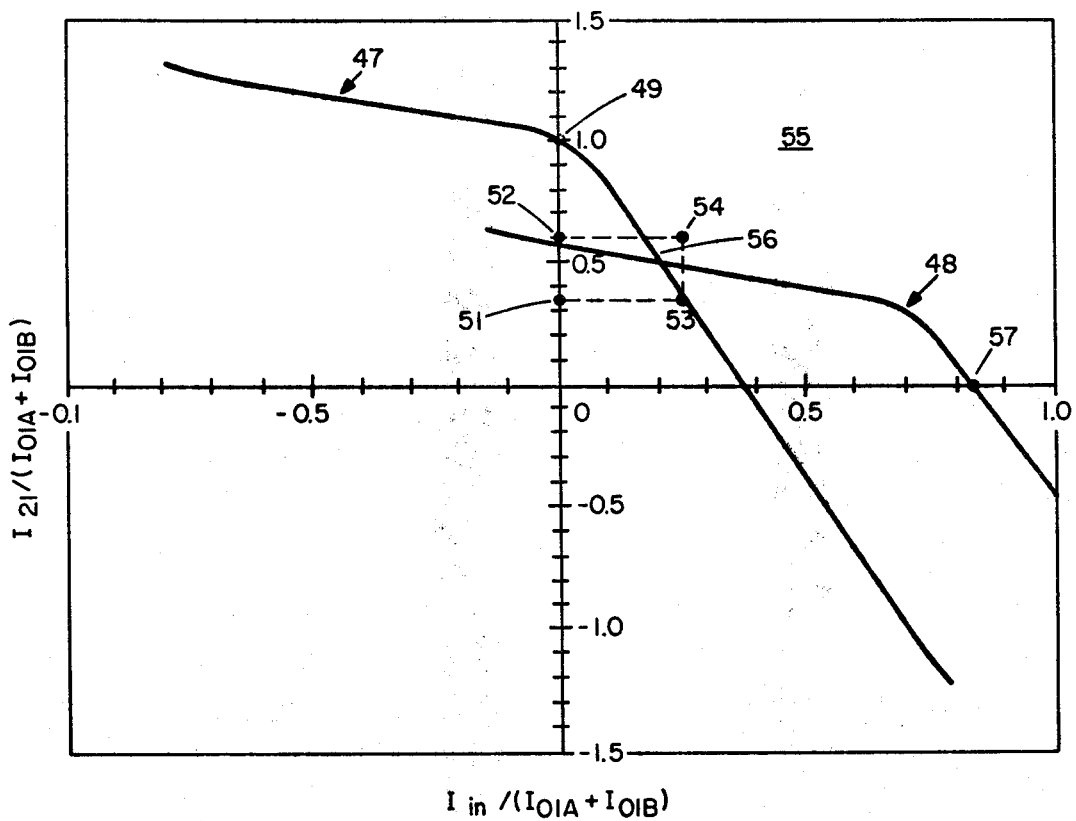
FIG. 3 is a diagram illustrating the biasing current conditions and the threshold curve of the interferometer of FIG. 1.

Refer now to FIGS. 1 and 3 showing the circuit 20 and the biasing conditions and threshold curve for the interferometer 20. The curve 47, 48 represent the threshold curve for the Josephson junctions 26, 27 of the interferometer 20. The point 49 on curve 47 represents the minimum biasing current $I_{21}$ at point 21 feeding the interferometer 20 which is capable of initiating switching of the interferometer 20. Point 51 represents a biasing condition for the amount of current $I_{21}$ which is predetermined for the preferred operating conditions of the interferometer 20. $I_{21}$ is equal to $$I_b \times \frac{R_2}{R_1 + R_2}.$$

At point 51 there is no current input from the inputs 22 or 24. Point 52 represents the point at which additional current has been applied at the input 22 to drive the interferometer 20 to a no voltage state in which the point 52 exceeds the threshold curve 48 but does not exceed the threshold curve 47 so as to initiate switching. Point 53 represents the point at which the current input at input 24 only is insufficient to drive the interferometer 20 past the threshold curves 47 and 48. Point 54 represents a point past the threshold curves at which current has been applied at both inputs 22 and 24 so as to drive the interferometer 20 past both the threshold curves 47 and 48 so as to initiate switching of Josephson junction 26 and then Josephson junction 27. Thus, it will be understood that the area 55 represents the operating window area of the interferometer 20 and that the boundary or threshold is defined by the points 49, 56 and 57 on curves 47 and 48.

Having explained the advantages of the novel Josephson junction circuit 10 for use as a high-gain AND gate, it will be understood that it will also function as an OR gate when sufficient signal input current is applied to either input 22 or 24. While this OR gate function is not as efficient as our aforementioned co-pending application Ser. No. 298,149, it does provide an operable and efficient OR gate which is present and available when the circuit 10 is implemented as a large integrated circuit chip.

By properly adjusting the resistors and critical currents $I_0$ of the Josephson junctions, we are able to change the region 46 of FIG. 2, where the circuit 10 can function as an OR gate to enhance the operation of the circuit 10 as an OR gate.

The input and output currents of the novel circuit 10 are capable of being scaled up or scaled down as long as the conditions and boundaries described hereinbefore are followed.

I claim:

1. A four Josephson junction direct coupled isolation AND gate circuit, comprising,
a biasing current source,
a low reference voltage,
a first branch electrically connected in series between said biasing current source and said reference voltage,
said first branch comprising a first resistor, a third Josephson junction and an interferometer in series between said biasing current source and said low reference voltage,
a first signal input connected intermediate said third Josephson junction and said interferometer,
a second signal input connected to said interferometer,
a sink resistor connected between said interferometer and said reference voltage and being connected parallel to said interferometer,
a second branch electrically connected in series between said biasing current source and said low reference voltage,
said second branch comprising a second resistor and a second Josephson junction in series between said biasing current source and said low reference voltage,
a signal output mode intermediate said second resistor and said second Josephson junction device, and
a load impedance connected between said signal output node and said low reference voltage,
said interferometer and said second and said third Josephson junctions having a predetermined critical current,
said critical current of said interferometer and said Josephson junctions being selectively predetermined to cause the switching of said interferometer to switch before said second Josephson junction and said second Josephson junction to switch before said third Josephson junction.

2. A four Josephson junction circuit as set forth in claim 1 wherein the product of the resistor $R_1$ in the first branch times the critical current $I_{o3}$ of the third Josephson junction $J_3$ is approximately equal to the product of the second resistor $R_2$ in the second branch times the crictical current $I_{o2}$ of the second Josephson junction $J_2$.

3. A four Josephson junction circuit as set forth in claim 1 wherein said interferometer comprises first and second inductive reactances connected at their intermediate junction to said third Josephson junction and form two parallel branches connected to said low reference voltage, and
a pair of unmatched Josephson junctions, one in each of said inductive reactance branches of said inteferometer, each of said unmatched Josephson junctions having a predetermined critical current $I_0$.

4. A four Josephson junction circuit as set forth in claim 3 wherein the ratio of the critical currents $I_0$ of the pair of unmatched Josephson junctions is approximately three to one.

5. A four Josephson junction circuit as set forth in claim 4 wherein the product of the critical currents $I_0$ of each unmatched Josephson junction times the inductive reactance in said respective parallel branches is approximately equal.

6. A four Josephson junction circuit as set forth in claim 5 wherein the product of the critical current of the larger Josephson junction of said interferometer times the sum of said inductive reactances is equal to 1.5 times the flux quanta $\phi_0$.

7. A four Josephson junction circuit as set forth in claim 3 wherein said sink resistor is preferably connected in parallel across said intermediate junctions of said inductive reactances.

8. A four Josephson junction circuit as set forth in claim 3 wherein said sink resistor is connected in parallel across one of said unmatched Josephson junctions of said interferometer.

* * * * *